United States Patent
Ohtani

(10) Patent No.: US 7,135,739 B2
(45) Date of Patent: Nov. 14, 2006

(54) VERTICAL-TYPE METAL INSULATOR SEMICONDUCTOR FIELD EFFECT TRANSISTOR DEVICE, AND PRODUCTION METHOD FOR MANUFACTURING SUCH TRANSISTOR DEVICE

(75) Inventor: Kinya Ohtani, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/998,943

(22) Filed: Nov. 30, 2004

(65) Prior Publication Data

US 2005/0133856 A1 Jun. 23, 2005

(30) Foreign Application Priority Data

Dec. 22, 2003 (JP) .............................. 2003-425974

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................. 257/329; 257/328; 257/E21.383
(58) Field of Classification Search ................. 257/329, 257/327, 328, E21.383; 438/212, 268
See application file for complete search history.

(56) References Cited

U.S. PATENT DOCUMENTS 6,184,555 B1 * 2/2001 Tihanyi et al. ............... 257/342
6,489,651 B1 * 12/2002 Kim ............................. 257/327
6,635,946 B1 * 10/2003 Lai et al. ..................... 257/510
6,784,059 B1 * 8/2004 Taniguchi et al. ........... 438/275
2006/0001084 A1 * 1/2006 Kelly et al. ................. 257/329

FOREIGN PATENT DOCUMENTS

| JP | 2-37777 | 2/1990 |
| JP | 10-173178 | 6/1998 |
| JP | 10-270693 | 10/1998 |

* cited by examiner

*Primary Examiner*—Nathan J. Flynn
*Assistant Examiner*—Victor A. Mandala, Jr.
(74) *Attorney, Agent, or Firm*—McGinn IP Law Group, PLLC

(57) ABSTRACT

In a vertical-type metal insulator field effect transistor device having a first conductivity type drain region layer, a plurality of second conductivity type base regions are produced and arranged in the first conductivity type drain region layer, and a first conductivity type source region is produced in each of the second conductivity type base regions. Both a gate insulating layer and a gate electrode layer are formed on the first conductivity type drain region layer such that a plurality of unit transistor cells are produced in conjunction with the second conductivity type base regions and the first conductivity type source regions, and each of the unit transistor cells includes respective span portions of the gate insulating layer and the gate electrode layer, which bridge a space between the first conductivity type source regions formed in two adjacent second conductivity base regions. A buried-insulator region is produced in the first conductivity type drain region layer beneath each of the portions of the gate electrode layer.

9 Claims, 9 Drawing Sheets

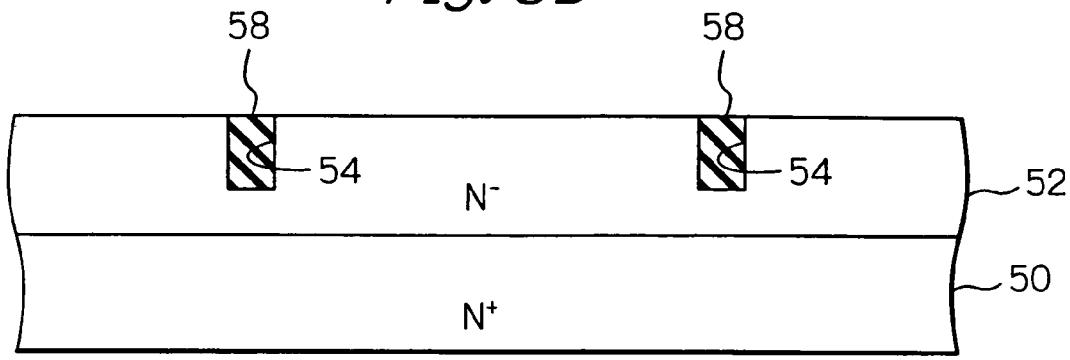
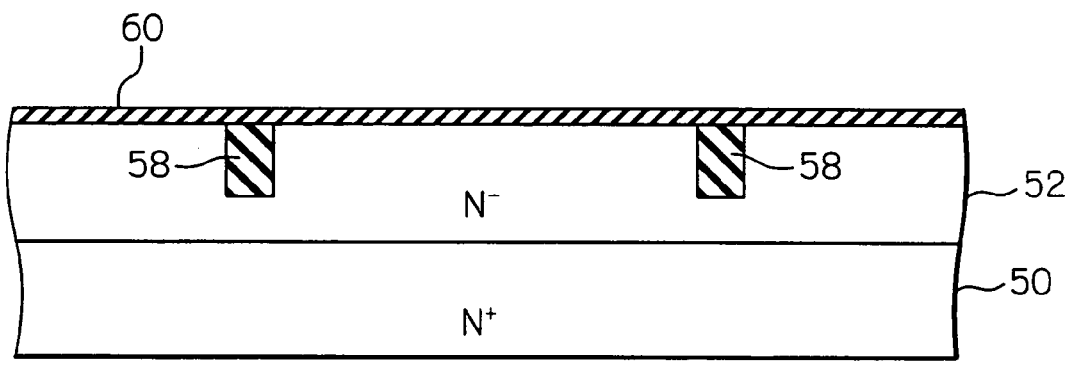
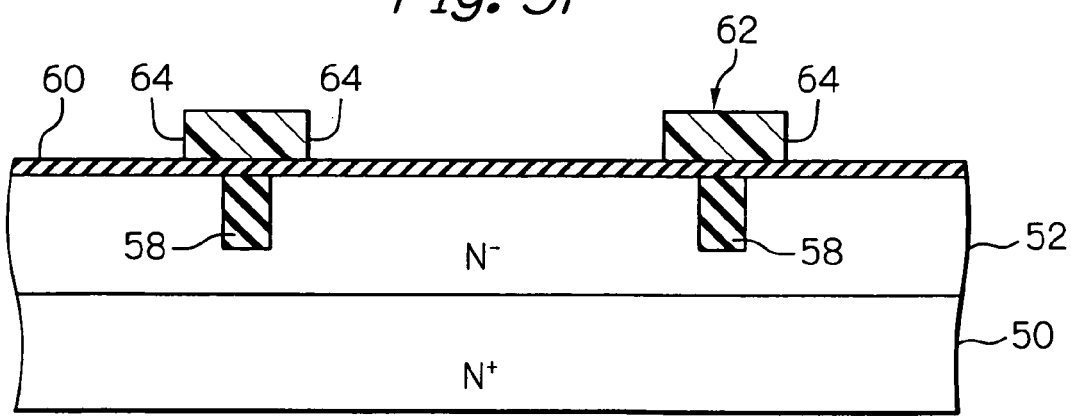

_US 7,135,739 B2_

VERTICAL-TYPE METAL INSULATOR SEMICONDUCTOR FIELD EFFECT TRANSISTOR DEVICE, AND PRODUCTION METHOD FOR MANUFACTURING SUCH TRANSISTOR DEVICE

BACKGROUND OF THE INVENTION

1. Field of the Invention

The present invention generally relates to a vertical-type metal insulator semiconductor field effect transistor (MISFET) device, and a production method for manufacturing such a vertical-type MISFET device.

2. Description of the Related Art

As well known, a metal insulator field effect transistor (MISFET) device is represented by a metal oxide semiconductor field effect transistor (MOSFET) device, and there are two types of MOSFET devices. One type of the MOSFET device is disclosed in, for example, JP-A-H10-270693, and is frequently called a horizontal-type MOSFET device in which a drain current flows horizontally in parallel with the plane of a semiconductor substrate. The other type of the MOSFET device is disclosed in, for example, in JP-A-H10-173178, and is frequently called a vertical-type MOSFET device in which a drain current flows vertically, perpendicularly to the plane of a semiconductor device.

The vertical-type MOSFET device is frequently used as a power MOSFET device, because a large amount of drain current can be obtained. In particular, the vertical-type MOSFET device includes a plurality of unit transistor cells (MOSFET) produced and arranged in the semiconductor substrate, and the plurality of unit transistor cells function as a MOSFET. Thus, in the vertical-type MOSFET device, it is possible to obtain a large total amount of drain current.

One of the significant factors for evaluating the vertical-type power MOSFET device is responsivity to application of voltage to a gate electrode in the vertical-type power MOSFET device. In general, the smaller a gate-drain capacitance in the vertical-type power MOSFET device, the higher the responsivity for driving the vertical-type power MOSFET device at a higher speed.

Also, as well known, an ON-resistance and a breakdown voltage in the vertical-type power MOSFET device form significant factors for evaluating the vertical-type power MOSFET device. The smaller the ON-resistance, the higher the evaluation of the vertical-type power MOSFET device. Nevertheless, in general, as the ON-resistance becomes smaller, the breakdown voltage is lowered. Namely, the decrease of the ON-resistance is incompatible with the increase of the breakdown voltage.

In the vertical-type power MOSFET device disclosed in JP-A-H10-173178, a gate-drain capacitance is relatively small, and thus it features an inferior responsivity to application of voltage to a gate electrode, as stated in detail hereinafter. Namely, the vertical-type power MOSFET device concerned cannot be driven at a higher speed. Also, the vertical-type power MOSFET disclosed in JP-A-H10-173178 fails to feature a high breakdown voltage, as stated in detail hereinafter.

SUMMARY OF THE INVENTION

Therefore, an object of the present invention is to provide a vertical-type power MOSFET device in which not only can a high responsivity to application of voltage to a gate electrode be achieved, but also a high breakdown voltage can be obtained.

Another object of the present invention is to provide a production method for manufacturing such a vertical-type power MOSFET device.

In accordance with a first aspect of the present invention, there is provided a vertical-type metal insulator field effect transistor (MISFET) device comprising a first conductivity type drain region layer, a plurality of second conductivity type base regions produced and arranged in the first conductivity type drain region layer, a first conductivity type source region produced in each of the second conductivity type base regions, both a gate insulating layer and a gate electrode layer formed on the first conductivity type drain region layer such that a plurality of unit transistor cells are produced in conjunction with the second conductivity type base regions and the first conductivity type source regions, each of the unit transistor cells including respective span portions of the gate insulating layer and the gate electrode layer, which bridge a space between the first conductivity type source regions formed in two adjacent second conductivity base regions, and a buried-insulator region produced in the first conductivity type drain region layer beneath each of the portions of the gate electrode layer.

The first conductivity type drain layer may include a first conductivity type semiconductor substrate, and a first conductivity type drift layer formed thereon and having a first conductivity type impurity concentration smaller than that of the first conductivity type semiconductor substrate, the production and arrangement of the second conductivity type base regions being carried out in the first conductivity type drift layer.

Preferably, each of the buried-insulator regions is integrated with a corresponding span portion of the gate insulating layer. Also, preferably, each of the second conductivity type base regions has a depth which is equal to or more than that of each of the buried-insulator regions.

In this vertical-type power MISFET device, a space, which is defined between each of the buried-insulator regions and the adjacent second conductivity type base regions may be set such that depletion regions, which are created along P-N junctions between the first conductivity type drain region layer and the second conductivity type base regions, are integrated with each other to thereby produce a single depletion region when a gate-drain is reversely biased.

Also, in this vertical-type power MISFET device, a frame-like isolation layer may be formed on the first conductivity type drain region layer along peripheral sides thereof, such that a portion of the frame-like isolation layer is buried in the first conductivity type drain region layer.

In accordance with a second aspect of the present invention, there is provided a production method for manufacturing a vertical-type metal insulator field effect transistor device, which comprises the steps of: preparing a first conductivity type drain region layer; forming a plurality of trenches at a given pitch in the first conductivity type drain region layer; stuffing the trenches with an insulating material to thereby producing buried-insulator regions; forming a gate insulating layer on the first conductivity type drain region; implanting second conductivity type impurities in the first conductivity type drain region layer to thereby produce a plurality of second conductivity type base regions in the first conductivity type drain region layer such that each of the second conductivity type base regions is positioned between two adjacent buried-insulator regions; forming a gate electrode layer on the gate insulating layer; patterning the gate electrode layer such that a portion of the gate electrode layer is defined as a span portion which bridges a space between two adjacent second conductivity type base regions; implanting first conductivity type impurities in the second conductivity type base regions to thereby produce a first conductivity type source region in each of the second conductivity type base regions; and patterning the gate insulating layer such that a portion of the gate insulating layer is defined as a span portion which bridges a space between two adjacent second conductivity type base regions.

The preparation of the first conductivity type drain region layer may include the steps of: preparing a first conductivity type semiconductor substrate; and forming a first conductivity type drift layer formed on the first conductivity type semiconductor substrate, with the first conductivity type drift layer having a first conductivity type impurity concentration smaller than that of the first conductivity type semiconductor substrate, the production of the second conductivity type base regions being carried out is in the first conductivity type drift layer.

In this production method, an insulating interlayer may be formed on the gate insulating layer before the patterning of the gate insulating layer, and both the insulating interlayer and the gate insulating layer are perforated so that a contact hole is formed therein at each of the second conductivity type base regions, whereby both a part of the second conductivity type base region and a part of the first conductivity type source region 76 are exposed to the outside, with the gate insulating layer being patterned such that a portion of the gate insulating layer is defined as a span portion which bridges a space between two adjacent second conductivity type base regions.

The production method according to the present invention may further comprise the step of forming a source gate electrode layer on the perforated insulating interlayer such that the contact holes is stuffed with a conductive material forming the source gate electrode layer. In this case, the production of the second conductivity type base regions may be carried out such that each of the second conductivity type base regions has a depth which is equal to or more than that of each of the buried-insulator regions.

In this production method, a space, which is defined between each of the buried-insulator regions and adjacent second conductivity type base regions may be set such that depletion regions, which are created along P-N junctions between the first conductivity type drain region layer and the second conductivity type base regions, are integrated with each other to thereby produce a single depletion region when a gate-drain is reversely biased.

The production method may further comprise the step of forming a frame-like isolation layer on the first conductivity type drain region layer along peripheral sides thereof, and a portion of the frame-like isolation layer may be buried in the first conductivity type drain region layer. In this case, preferably, both the formation of the frame-like isolation layer the formation of the buried-insulator regions are simultaneously carried out.

BRIEF DESCRIPTION OF THE DRAWINGS

The above objects and other objects will be more clearly understood from the description set forth below, with reference to the accompanying drawings, wherein:

FIG. 5D is a partial cross-sectional view, similar to FIG. 5C, showing a fourth representative step of the embodiment of the production method according to the present invention;

FIG. 5E is a partial cross-sectional view, similar to FIG. 5D, showing a fifth representative step of the embodiment of the production method according to the present invention;

FIG. 5F is a partial cross-sectional view, similar to FIG. 5E, showing a sixth representative step of the embodiment of the production method according to the present invention;

DESCRIPTION OF THE PREFERRED EMBODIMENTS

Before description of an embodiment of the present invention, for better understanding of the present invention, prior art MOSFET devices will be explained with reference to FIGS. 1 to 4.

Figure 1:
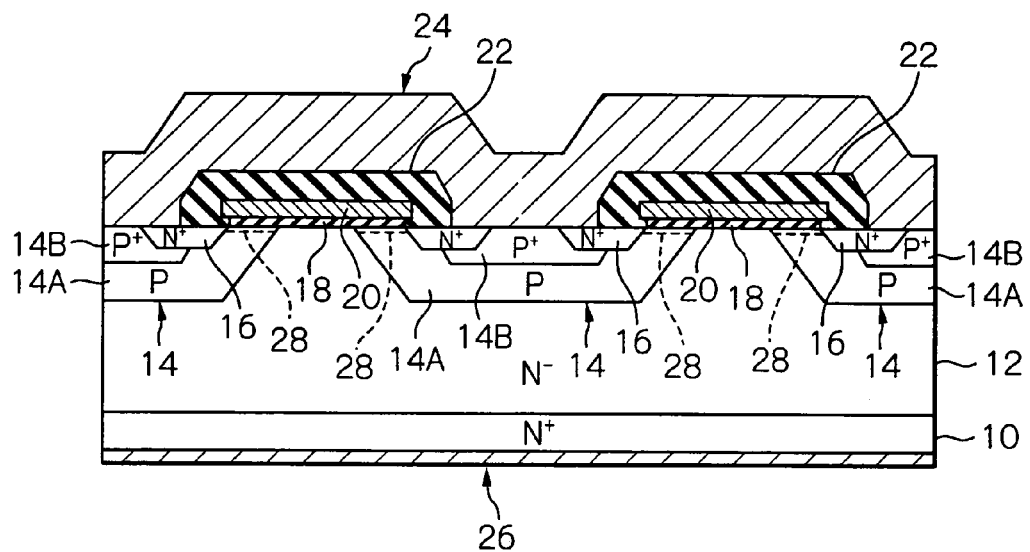
FIG. 1 is a partial cross-sectional view showing a structure of a prior art vertical-type power MOSFET device.

FIG. 1 illustrates a prior art structure of a vertical-type power MOSFET device, as disclosed in JP-A-H10-173178. This vertical-type power MOSFET device includes an N$^+$-type semiconductor substrate 10, which is obtained from, for example, an N$^+$-type monocrystalline silicon wafer, and an N$^{-1}$-type epitaxial layer 12 is formed as a drift layer on the N$^+$-type semiconductor substrate 10. As is apparent from FIG. 1, a plurality of P-type base regions 14 are formed in the N$^-$-type drift layer 12, and each of the P-type base regions 14 includes a p-type base region section 14A, and a p$^+$-type base region section 14B formed in the p-type base region section 14A. The formation of the respective base region sections 14A and 14B is carried out by implanting P-type impurities, such as boron ions (B$^+$) or the like therein. An annular N$^+$-type source region 16 is formed in each of the P-type base region 14 by implanting N-type impurities, such as phosphorus ions (P$^+$) or the like therein.

Also, the vertical-type power MOSFET device includes a plurality of silicon dioxide layers 18, each of which is formed as a gate insulating layer on the N$^-$-type drift layer 12 so as to cover an inner area of a corresponding annular N$^+$-type source region 16. Further, the vertical-type power MOSFET device includes a gate electrode layer 20 formed on each of the gate insulating layers 18, and both the gate insulating layer 18 and the gate electrode layer 20 are covered with an insulating interlayer 22.

Further, the vertical-type power MOSFET device includes a source electrode layer 24 covering the insulating interlayer 22 and the surfaces of the P-type base regions 14 so as to be in electrical contact with the annular N$^+$-type source region 16, and a drain electrode layer 26 formed on the rear surface of the N$^+$-type semiconductor substrate 10. Note, in this vertical-type power MOSFET device, both the N$^+$-type semiconductor substrate 10 and the N$^-$-type drift layer 12 function as a drain region.

Thus, in the vertical-type power MOSFET device as shown in FIG. 1, when the gate-source is forwardly biased, a horizontal inversion region or channel 28 is produced at the surface portion of each of the P-type base regions 14 which is sited beneath the gate electrode layer 20, whereby an ON-current flows from the annular N$^+$-type source regions 16 toward the drain electrode layer 26 through the N$^-$-type drift layer 12 in accordance with a voltage applied between the annular N$^+$-type source regions 16 and the drain electrode layer 26.

As well known, an amount of the ON-current depends upon an ON-resistance produced in the interior of the power MOSFET device. In general, the ON-resistance is defined as a sum of resistance values of the N$^+$-type source region 16, the horizontal channel 28, the N$^-$-type drift layer 12 and the N$^+$-type semiconductor substrate 10. However, in the vertical-type power MOSFET device shown in FIG. 1, the ON-resistance further includes a junction FET resistance "JR" produced between the two adjacent P-type base regions 14, as conceptually and symbolically shown in FIG. 2. In particular, while the gate-source is forwardly biased, a slight depletion region is created along the P-N junction between each of the P-type base regions 14 and the N-type epitaxial layer or N$^-$-type drift layer 12, and the creation of the slight depletion region is performed so as to restrict the horizontal channel 28.

Figure 2:
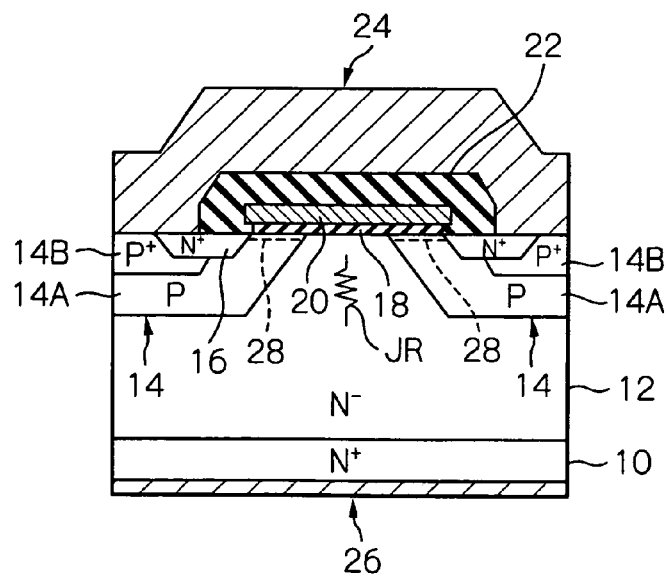
FIG. 2 is a partial cross-sectional view, similar to FIG. 1, in which a junction FET resistance is conceptually and symbolically shown.

With the arrangement of the vertical-type power MOSFET device shown in FIGS. 1 and 2, the junction FET resistance JR is relatively large, and thus the ON-resistance becomes larger.

Figure 3:
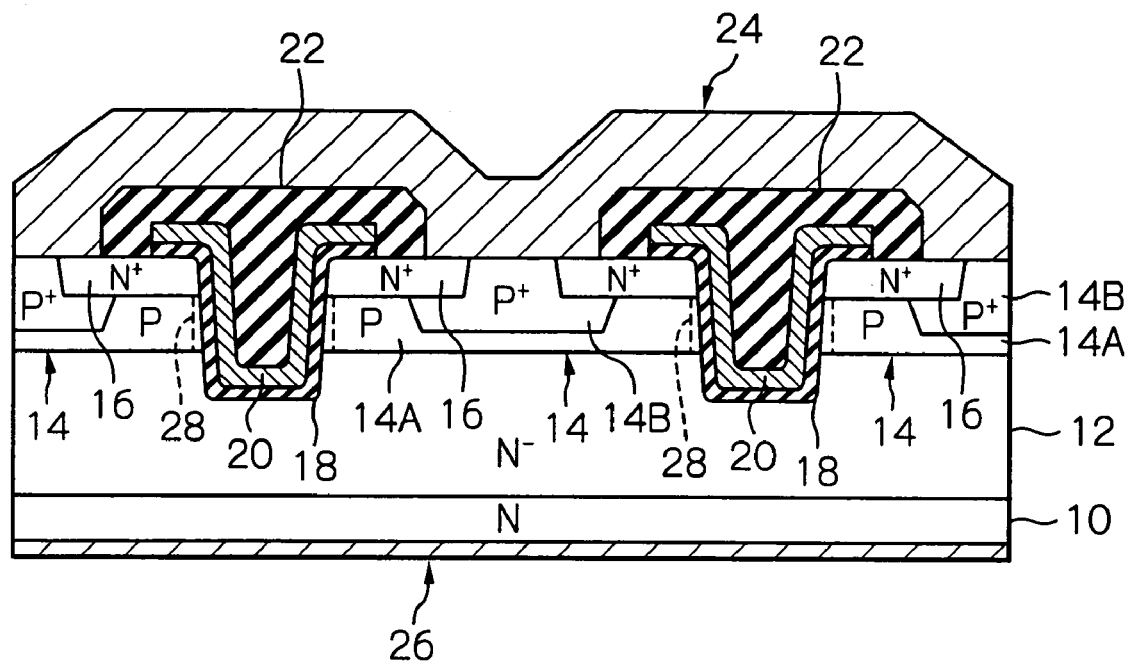
FIG. 3 is a partial cross-sectional view showing a structure of another prior art vertical-type power MOSFET device.

Therefore, JP-A-H10-173178 has proposed an improvement of the vertical-type power MOSFET device, as shown in FIG. 3, in which the same references as in FIGS. 1 and 2 represent the same features.

As shown in FIG. 3, in this vertical-type power MOSFET device, each of gate insulating layers 18 has a generally U-shaped configuration in a vertical cross section, and extends into an N$^-$-type drift layer 12 between two adjacent annular N$^+$-type source regions 16 and between two adjacent a P-type base regions 14. Similarly, each of gate electrode layers 20 has a generally U-shaped configuration in a vertical cross section, and is formed along a corresponding generally U-shaped gate insulating layer 18. Also, each of insulating interlayers 22 is formed on a corresponding generally U-shaped gate electrode layer 20 such that a space defined by the U-shaped gate electrode layer 20 is stuffed with an insulating material forming the insulating interlayer 22.

In the vertical-type power MOSFET device as shown in FIG. 3, when the gate-source is forwardly biased, a vertical inversion region or channel 28 is produced at the side surface portion of each of the p-type base regions 14 which is in contact with the side wall of each of the generally U-shaped gate insulating layers 18.

Similar to the vertical-type power MOSFET device shown in FIGS. 1 and 2, while the gate-source is forwardly biased, a slight depletion region is created along the P-N junction between each of the P-type base regions 14 and the N$^-$-type epitaxial layer or N$^-$-type drift layer 12, but the creation of the slight depletion region is performed without substantially restricting the vertical channel 28.

Thus, with the arrangement of the vertical-type power MOSFET shown in FIG. 3, an ON-resistance becomes smaller in comparison with the arrangement of the vertical-type power MOSFET shown in FIGS. 1 and 2. Nevertheless, as discussed hereinbefore, as the ON-resistance becomes smaller, the breakdown voltage is lowered.

By the way, in either event, since the gate insulating layer 18 is formed as a thin layer, a gate-drain capacitance between the gate electrode layer 20 and the N$^-$-type drift layer 12 (drain region) is very small. Thus, a responsivity to application of voltage to the gate electrode layer 20 is deteriorated.

Figure 4:
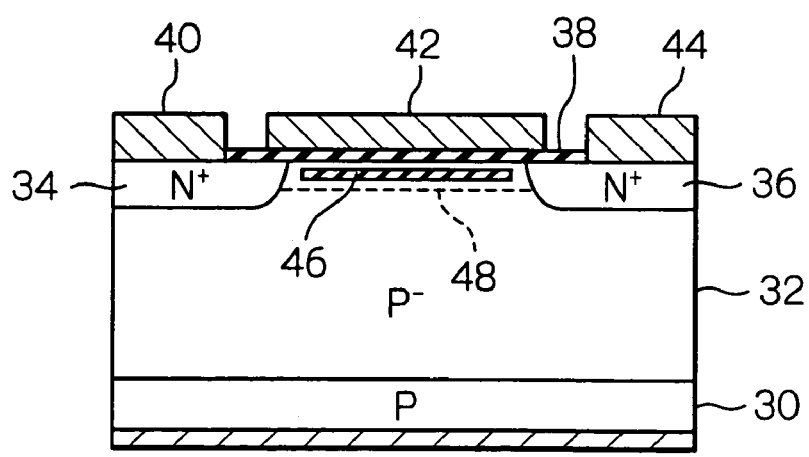
FIG. 4 is a partial cross-sectional view showing a structure of a prior art horizontal-type MOSFET device.

FIG. 4 illustrates a prior art structure of a horizontal-type power MOSFET device, as disclosed in JP-A-H10-173178. This horizontal-type MOSFET device includes a P-type semiconductor substrate 30, which is obtained from, for example, a P-type monocrystalline silicon wafer, and an P$^-$-type epitaxial layer 32 is formed on the P-type semiconductor substrate 30. The P$^-$-type epitaxial layer 32 has an N$^+$-type drain region 34 and an N$^+$-type source region 36 formed therein, and a gate insulating layer 38 is formed on the surface of the P$^-$-type epitaxial layer 32 so as to bridge a space between the N$^+$-type drain and source regions 34 and 36. The horizontal-type MOSFET device further includes respective drain, gate and source electrode layers 40, 42 and 44 formed on the drain region 40, the gate insulating layer 42 and the source region 44. As shown in FIG. 4, the horizontal-type MOSFET device features an insulating layer 46 which is buried in the P⁻-type epitaxial layer 32 beneath the gate insulating layer 42 so as to extend between the drain region 34 and the source region 36. Thus, when the gate-source is forwardly biased, an inversion region or channel 48 for a drain current is produced in the P⁻-type epitaxial layer 32 beneath the insulating layer 46.

With the arrangement of the horizontal-type MOSFET device as shown in FIG. 4, a channel or gate capacitance becomes smaller due to the existence of the insulating layer 46, and thus a responsivity to application of voltage to the gate electrode layer 42 can be improved, but the drain current flowing the channel 48 may be hindered by the existence of the insulating layer 46.

Next, with reference to FIGS. 5A to 5N, an embodiment of a production method for manufacturing a vertical-type power MOSFET device according to the present invention will now be explained.

Figure 5A:
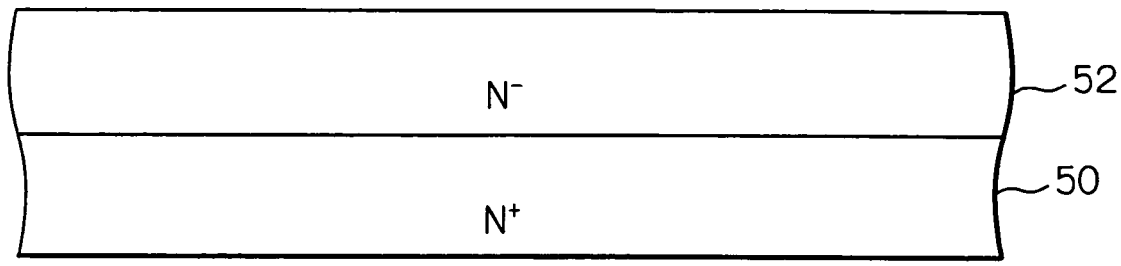
FIG. 5A is a partial cross-sectional view of an $N^+$-type semiconductor substrate and an $N^-$-type epitaxial layer formed thereon, showing a first representative step of an embodiment of a production method for manufacturing a vertical-type power MOSFET device according to the present invention.

First, as shown in FIG. 5A, an N⁺-type semiconductor substrate 50, which has a thickness falling within a range from 150 μm to 300 μm, is prepared, and an N⁻-type epitaxial layer 52, which has a thickness falling within a range from 6 μm to 10 μm, is formed as an N⁻-type drift layer on the N⁺-type semiconductor substrate 50. The N⁺-type semiconductor substrate 50 is derived from, for example, an N⁺-type monocrystalline silicon wafer in which N-type impurities, such as phosphorus ions (P⁺), arsenic (As⁺) or the like, are doped at an impurity concentration falling within a range from $1 \times 10^{19}/cm^3$ to $1 \times 10^{20}/cm^3$. Also, the N⁻-type epitaxial layer 52 contains N-type impurities, such as phosphorus ions (P⁺), arsenic (As⁺) or the like at an impurity concentration falling within a range from $1 \times 10^{16}/cm^3$ to $1 \times 10^{17}/cm^3$.

Figure 5B:
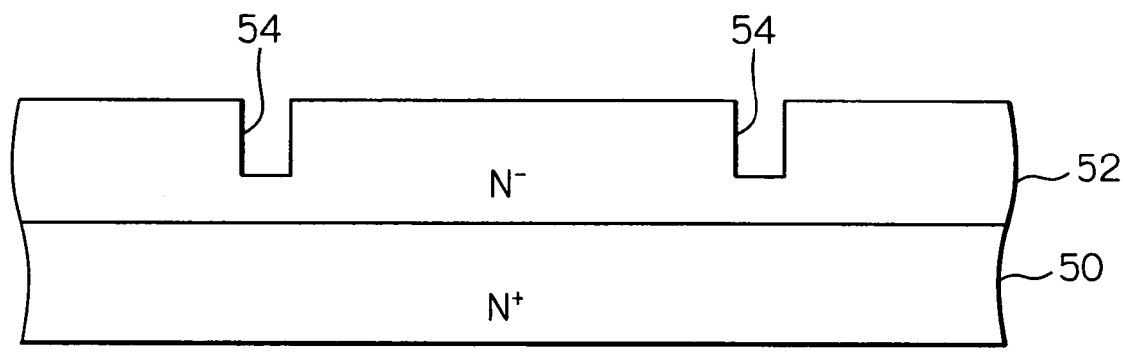
FIG. 5B is a partial cross-sectional view, similar to FIG. 5A, showing a second representative step of the embodiment of the production method according to the present invention.

After the formation of the N⁻-type drift layer 52, as shown in FIG. 5B, a plurality of trenches 54 are formed at a given pitch in the N⁻-type drift layer 52, using a photolithography process and a wet or dry etching process. Each of the trenches 54 penetrates into the N⁻-type drift layer 52 at a depth falling within a range from 0.8 μm to 1.5 μm, and has a width falling within a range from 0.8 μm to 1.5 μm.

Figure 5C:
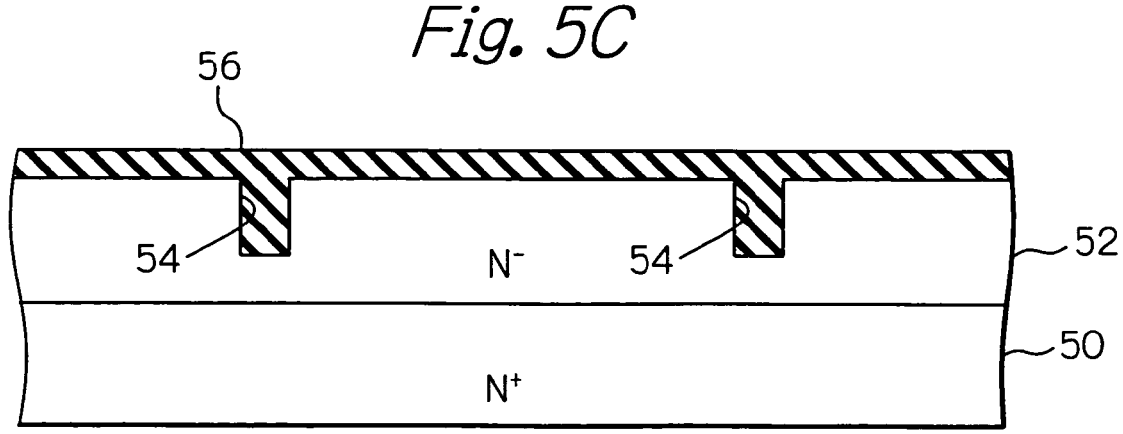
FIG. 5C is a partial cross-sectional view, similar to FIG. 5B, showing a third representative step of the embodiment of the production method according to the present invention.

After the formation of the trenches 54, as shown in FIG. 5C, a silicon dioxide layer 56 is formed as an insulating layer on the N⁻-type drift layer 52 by using a suitable chemical vapor deposition (CVD) process, so that the trenches 54 are stuffed with silicon dioxide. Then, a redundant material (SiO₂) is removed from the silicon dioxide layer 56 by using either a suitable chemical mechanical polishing (CMP) process or a suitable etching-back process, so that a plurality of trench-stuffed regions 58 are formed in the N⁻-type drift layer 52, as shown in FIG. 5D. Note, each of the trench-stuffed regions 58 is referred to as a buried-insulator region hereinafter.

After the formation of the buried-insulator regions 58, the N⁻-type drift layer 52 is subjected to a thermal oxidization process so that a silicon dioxide film layer 60 having a thickness falling within a range from 40 nm to 70 nm is formed as a gate insulating layer on the N⁻-type drift layer 52, as shown in FIG. 5E. Note, the buried-insulator regions 58 are integrated with the silicon dioxide film layer 60.

After the formation of the silicon dioxide film layer 60, a photoresist layer 62 is formed on the silicon dioxide film layer 60, and is patterned and produced as a mask by using a photolithography process and a wet or dry etching process, so that a plurality of openings 64, each of which corresponds to a P-type base region to be formed in the N⁻-type drift layer 52, are formed therein, as shown in FIG. 5F.

Figure 5G:
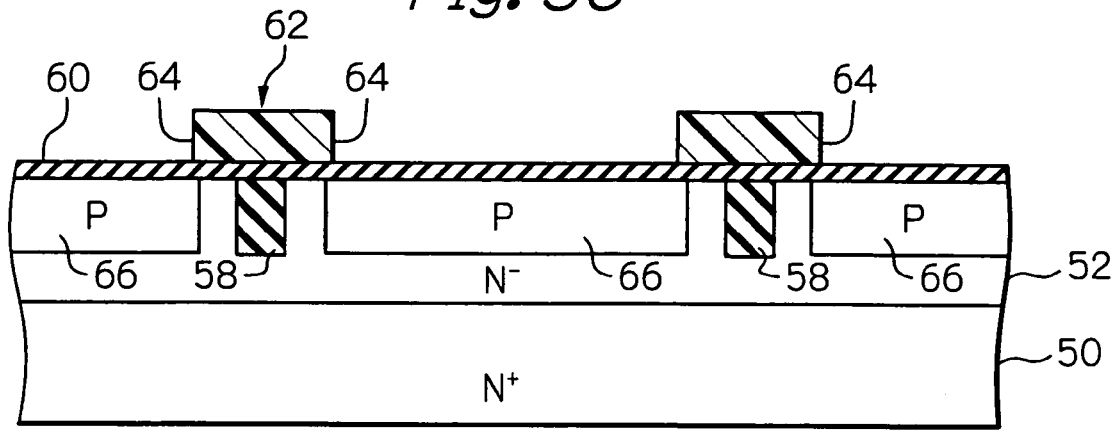
FIG. 5G is a partial cross-sectional view, similar to FIG. 5F, showing a seventh representative step of the embodiment of the production method according to the present invention.

Then, as shown in FIG. 5G, a plurality of P-type base regions 66 are produced at substantially the same pitch as that of the buried-insulator regions 58 in the N⁻-type drift layer 52 by implanting P-type impurities, such as boron ions (B⁺) or the like therein, using the patterned photoresist layer or mask 62 having the openings 64. As is apparent from FIG. 5G, each of the P-type base regions 66 is positioned between two adjacent buried-insulator regions 58. Note, each of the P-type base regions 66 has a depth falling within a range from 1 μm to 3 μm, and an impurity concentration falling within a range from $1 \times 10^{17}/cm^3$ to $1 \times 10^{18}/cm^3$.

Figure 5H:
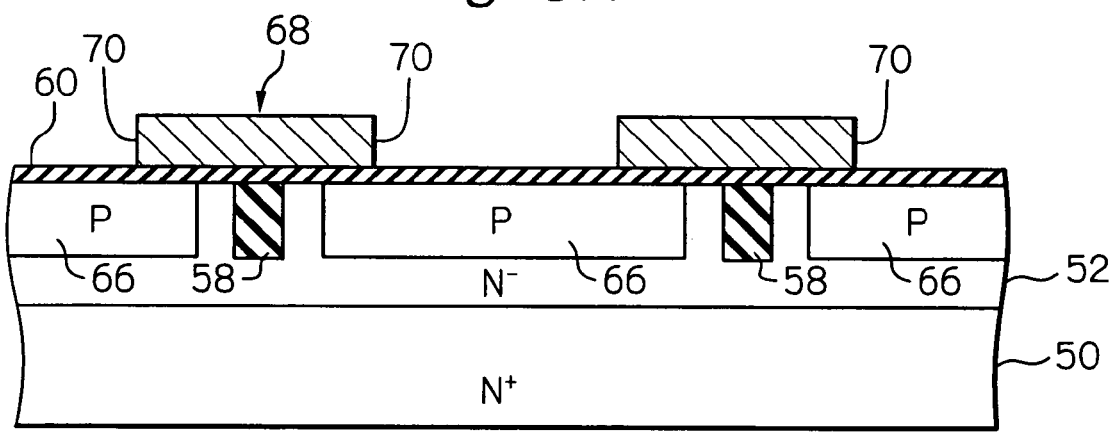
FIG. 5H is a partial cross-sectional view, similar to FIG. 5G, showing an eighth representative step of the embodiment of the production method according to the present invention.

After the production of the P-type base regions 66 in the N⁻-type drift layer 52, the patterned photoresist layer or mask 62 is removed from the silicon dioxide layer 60, a polycrystalline silicon layer 68 is formed on the silicon dioxide layer 60 by using a suitable CVD process, and is then patterned by using a photolithography process and an etching process so that a plurality of openings 70 are formed therein, as shown in FIG. 5H. As is apparent from this drawing, each of the openings 70 is positioned above a corresponding P-type base region 66, and has a size smaller than that of the P-type base region 66. Note, the patterned polycrystalline silicon layer 68, having the openings 70 formed therein, serves as a gate electrode layer.

Figure 5I:
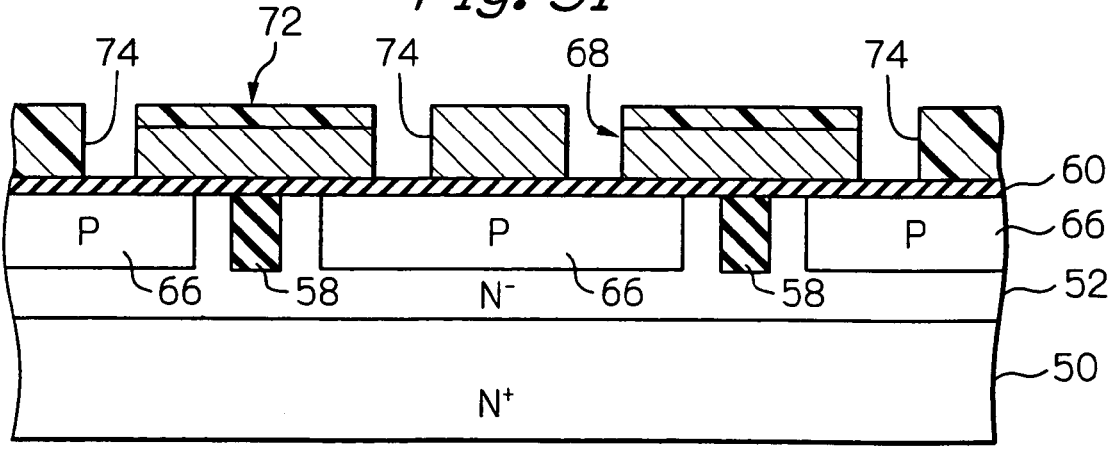
FIG. 5I is a partial cross-sectional view, similar to FIG. 5H, showing a ninth representative step of the embodiment of the production method according to the present invention.

After the formation of the patterned polycrystalline silicon layer or gate electrode layer 68, as shown in FIG. 5I, a photoresist layer 72 is formed on the gate electrode layer 68, and is then patterned and produced as a mask by using a photolithography process and a wet or dry etching process, so that a plurality of annular openings 74, each of which corresponds to an annular source region to be formed in a corresponding P-type region 66, are formed therein.

Figure 5J:
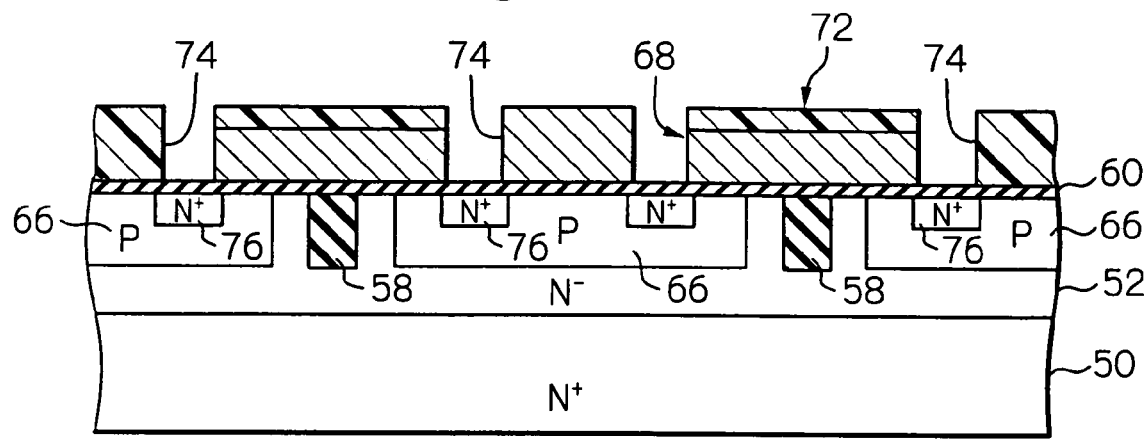
FIG. 5J is a partial cross-sectional view, similar to FIG. 5I, showing a tenth representative step of the embodiment of the production method according to the present invention.

Then, as shown in FIG. 5J, a plurality of annular N⁺-type source regions 76 are produced in the respective P-type base regions 66 by implanting N-type impurities, such as phosphorus ions (P⁺), arsenic (As⁺) or the like therein. Note, each of the annular N⁺-type source regions 76 has a depth falling within a range from 0.8 μm to 1.5 μm, and an impurity concentration falling within a range from $1 \times 10^{19}/cm^3$ to $1 \times 10^{20}/cm^3$. As a result, as is apparent from FIG. 5J, the patterned polycrystalline silicon layer or gate electrode layer 68 includes a span portion which bridges a space between two N⁺-type annular source regions 76 formed in two adjacent P-type base regions 66.

Figure 5K:
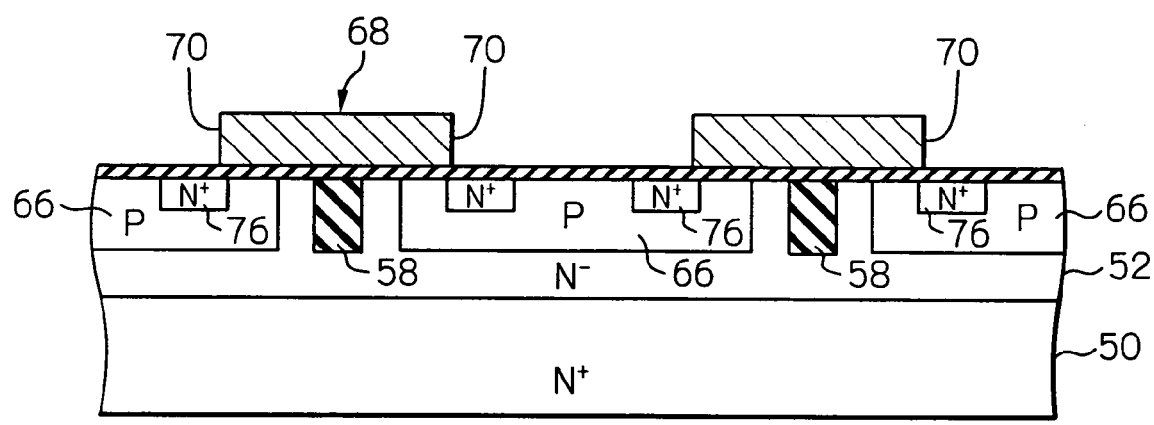
FIG. 5K is a partial cross-sectional view, similar to FIG. 5J, showing an eleventh representative step of the embodiment of the production method according to the present invention.
Figure 5L:
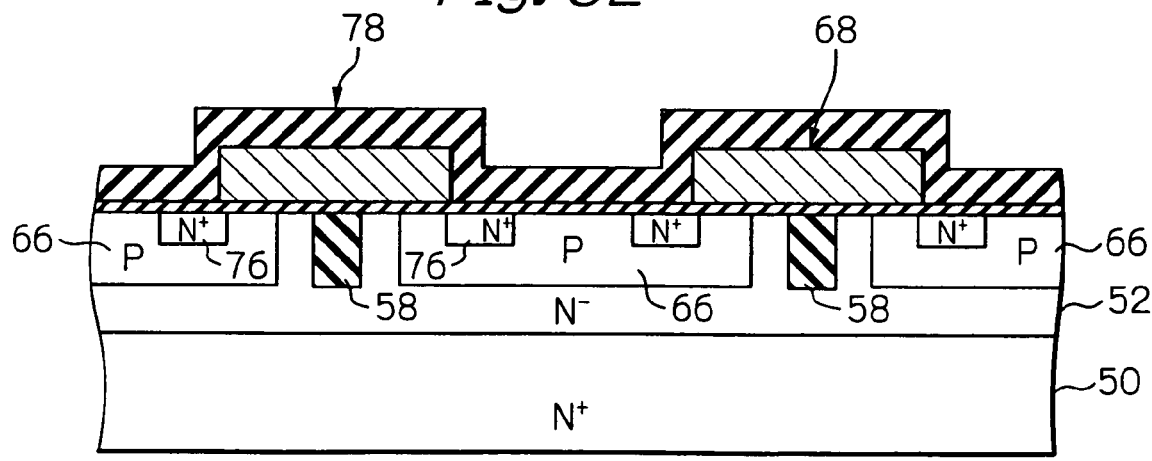
FIG. 5L is a partial cross-sectional view, similar to FIG. 5K, showing a twelfth representative step of the embodiment of the production method according to the present invention.

After the production of the annular N⁺-type source regions 76 in the respective P-type base regions 66, the patterned photoresist layer or mask 72 is removed from the gate electrode layer 68, as shown in FIG. 5K. Then, as shown in FIG. 5L, a silicon dioxide layer 78 is formed as an insulating interlayer on the gate electrode layer 68 having the openings 70 formed therein, by using a suitable CVD process. Note, the silicon dioxide layer or insulating interlayer 78 has a thickness falling within a range from 0.8 μm to 1.5 μm.

Figure 5M:
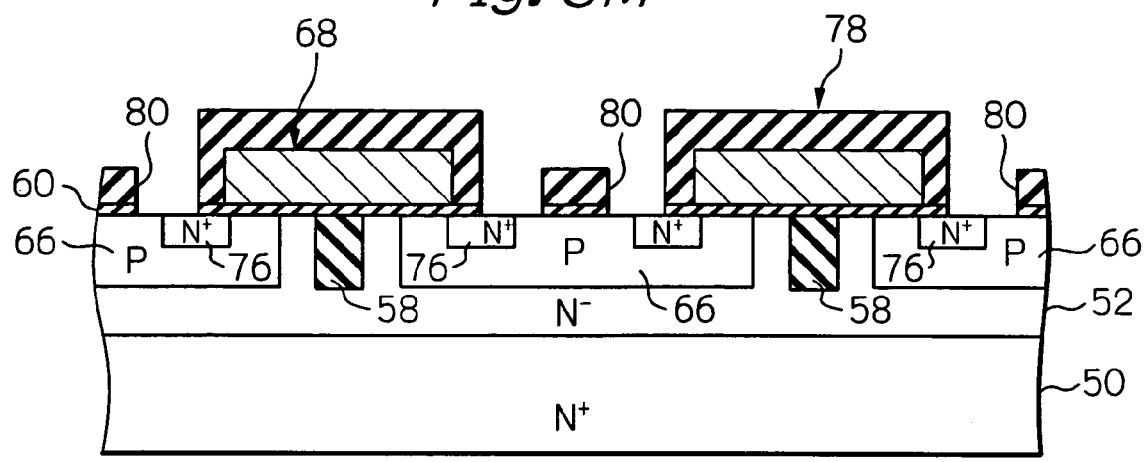
FIG. 5M is a partial cross-sectional view, similar to FIG. 5L, showing a thirteenth representative step of the embodiment of the production method according to the present invention.

After the formation of the insulating interlayer 78 on the gate electrode layer 68, both the silicon dioxide film layer 60 and the insulating interlayer 78 are perforated by using a photolithography process and a wet or dry etching process so that an annular contact hole 80 is formed therein at each of the P-type base regions 66, as shown in FIG. 5M. Namely, as is apparent from this drawing, the formation of the annular contact holes 80 is carried out such that both a part of each P-type base region 66 and a part of each annular N⁺-type source region 76 are exposed to the outside. Thus, the gate insulating layer 60 is patterned such that a portion of the gate insulating layer 60 is defined as a span portion which bridges a space between two N⁺-type annular source regions 76 formed in two adjacent P-type base regions 66.

Figure 5N:
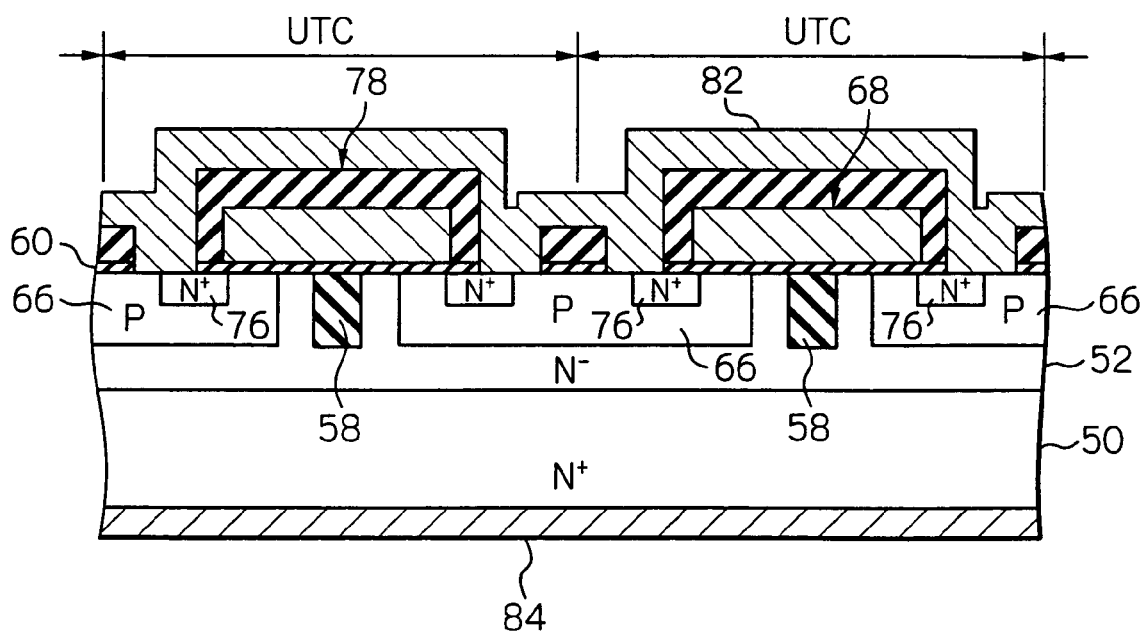
FIG. 5N is a partial cross-sectional view, similar to FIG. 5M, showing a fourteenth representative step of the embodiment of the production method according to the present invention.

After the formation of the annular contact holes 80 in the insulating interlayer 78, a conductive layer 82, composed of a suitable metal material, such as aluminum or the like, is formed as a source electrode layer on the insulating interlayer 78 by using a sputtering process, such that the annular contact holes 80 are stuffed with aluminum, to thereby establish electrical connections between the annular N⁺-source regions 76, as shown in FIG. 5N. Then, a drain electrode layer 84 is formed on the rear surface of the N⁺-type semiconductor substrate 50, resulting in completion of production of the vertical-type power MOSFET devices on the semiconductor substrate 50 according to the present invention is completed. Thereafter, the semiconductor substrate (silicon wafer) 50 is subjected to a dicing process, in which it is cut along scribe lines, whereby the vertical-type power MOSFET devices are separated from each other as bare chips.

As shown in FIG. 5N, the vertical-type MOSFET device includes a plurality of unit transistor cells, indicated by references UTC, which are produced and arranged in the diced semiconductor substrate 50, and the unit transistor cells UTC function as a MOSFET. Namely, both the N⁺-type semiconductor substrate 50 and the N⁻type drift layer 52 serve as a common drain region layer for all the unit transistor cells UTC. Thus, in the vertical-type MOSFET device, it is possible to obtain a large total amount of drain current.

Figure 6:
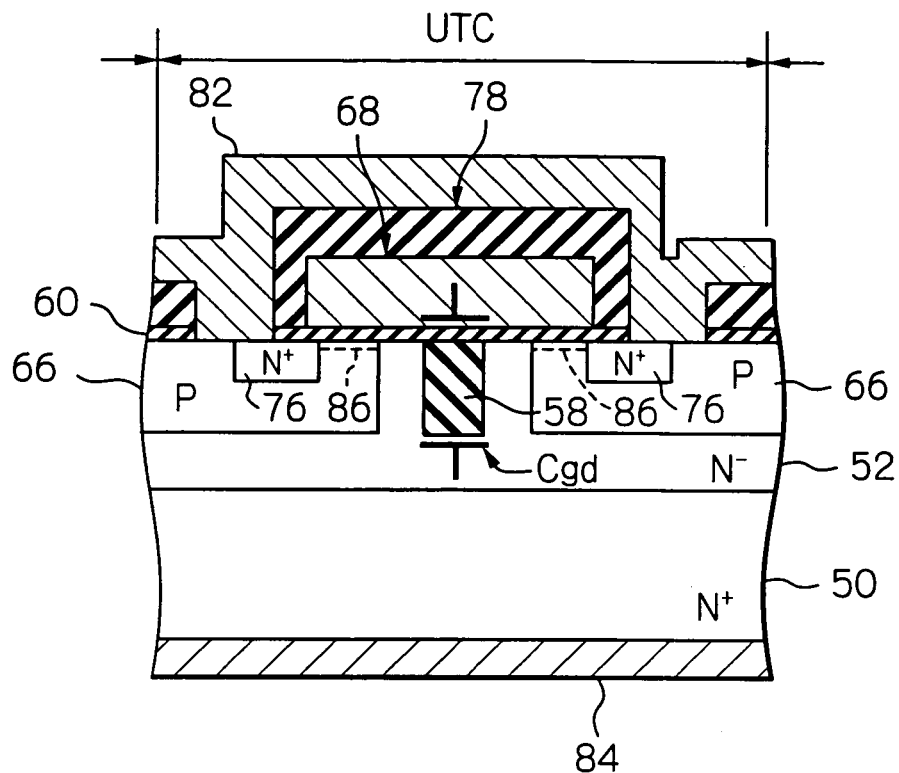
FIG. 6 is a partial cross-sectional view of the vertical-type power MOSFET device produced by the production method according the present invention, showing a state of the vertical-type power MOSFET device when a gate-drain is forwardly biased.

In this vertical-type MOSFET device, when the gate-drain is forwardly biased, a horizontal inversion region or channel 86 is produced at the surface portion of each of the P-type base regions 66 which is sited beneath the gate electrode layer 20, as shown in FIG. 6, whereby an ON-current flows from the N⁺-type source regions 76 toward the drain electrode layer 84 through the N⁻-type drift layer 52 and the N⁺-type semiconductor substrate 50 in accordance with a voltage applied to the gate electrode layer 68.

With the arrangement of the vertical-type MOSFET device according to the present invention, a gate-drain capacitance $C_{gd}$, which is conceptually and symbolically shown in FIG. 6, becomes smaller due to the existence of the buried-insulator regions 58, and thus it is possible to considerably improve responsivity to application of voltage to the gate electrode layer 68, whereby the vertical-type power MOSFET device can be driven at a higher speed.

Figure 7:
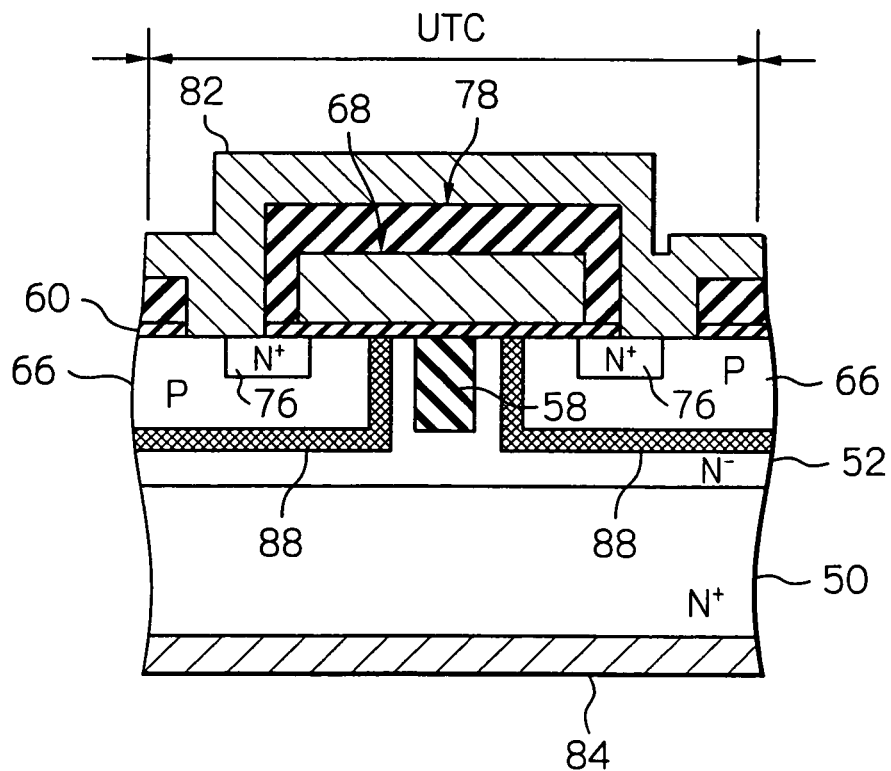
FIG. 7 is a partial cross-sectional view, similar to FIG. 6, showing a state of the vertical-type power MOSFET device when the gate-drain is not biased.
Figure 8:
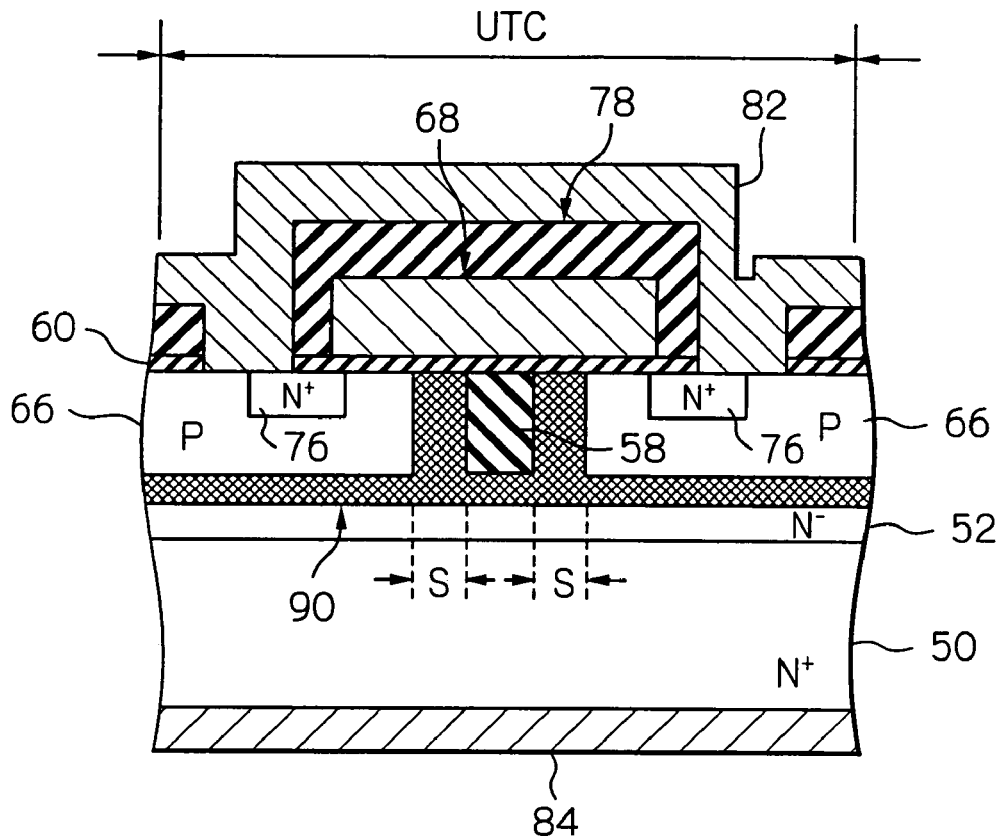
FIG. 8 is a partial cross-sectional view, similar to FIG. 6, showing a state of the vertical-type power MOSFET device when the gate-drain is reversely biased.

On the other hand, while the gate-drain is not biased, a depletion region 88 is created along the P-N junction between the N⁻-type drift layer 52 and each of the P-type base regions 66, as shown by a cross-hatched zone in FIG. 7. When the gate-drain is reversely biased, the depletion regions 88 are extended and thickened so as to be integrated with each other at a location at which each of the buried-insulator regions 58 is provided, whereby a single depletion region 90 is defined by the extended and thickened depletion regions 88, as shown by a cross-hatched zone in FIG. 8. As the reversely-biased voltage of the drain-source becomes higher, the single depletion region 90 is further thickened. Thus, since all the P-type base regions 66 are entirely covered with the thickened single depletion region 90, it is possible to considerably heighten a breakdown voltage in the vertical-type power MOSFET device according to the present invention.

In the above-mentioned embodiment, of course, a space (FIG. 8), which is defined between each of the buried-insulator regions 58 and the adjacent P-type base regions 66 is previously set such that the depletion regions 88 can be integrated with each other when the gate-drain is reversely biased.

Also, in the above-mentioned embodiment, preferably, each of the P-type base regions 66 has a depth which is equal to or more than that of the buried-insulator regions 58 so that the single depletion region 90 is flatly created and extended in the N⁻-type drift layer 52 beneath the P-type base regions, resulting in a further improvement of the breakdown voltage in the vertical-type power MOSFET device.

In the above-mentioned production method, the surface of the semiconductor substrate 50 is sectioned into a plurality of semiconductor chip areas by forming grid-like fine grooves (i.e. scribe lines) therein, and the respective vertical-type power MOSFET devices are produced in the chip areas.

Figure 9:
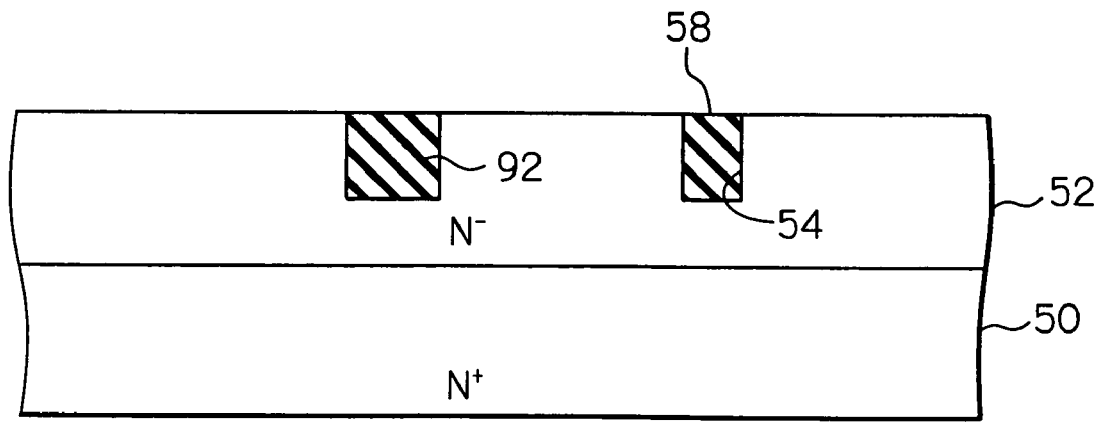
FIG. 9 is a partial cross-sectional view corresponding to 5D, showing a frame-like isolation layer formed on the N$^-$-type epitaxial layer along the sides of each of chip areas defined on the semiconductor substrate.

In the above-mentioned production method, the surface of the semiconductor substrate 50 is sectioned into a plurality of semiconductor chip areas by forming grid-like fine grooves (i.e. scribe lines) therein, and the respective vertical-type power MOSFET devices are produced in the chip areas. As shown in FIG. 9, a frame-like isolation layer 92 composed of silicon dioxide is formed and buried in the N⁻-type drift layer 52 along the sides of each of the chip areas, whereby it is possible to further improve the breakdown voltage in the produced vertical-type power MOSFET device.

In this case, it is preferable to simultaneously carry out both the formation of the frame-like isolation layer 92 and the formation of the buried-insulator regions 58. Although the formation of the frame-like isolation layer 92 per se is well known in this field, the simultaneous formation of the frame-like isolation layer 92 and buried-insulator regions 58 is very significant because the vertical-type power MOSFET devices according to the present invention can be produced without substantially increasing an additional process step for forming the buried-insulator regions 58, in comparison with a conventional production method for producing vertical-type power MOSFET devices.

Finally, it will be understood by those skilled in the art that the foregoing description is of preferred embodiments of the method and the device, and that various changes and modifications may be made to the present invention without departing from the spirit and scope thereof.

The invention claimed is:

1. A vertical-type metal insulator field effect transistor device comprising:
   a first conductivity type drain region layer;
   a plurality of second conductivity type base regions produced and arranged in said first conductivity type drain region layer;
   a first conductivity type source region produced in each of said second conductivity type base regions;
   both a flat gate insulating layer and a flat gate electrode layer formed on said first conductivity type drain region layer such that a plurality of unit transistor cells are produced in conjunction with said second conductivity type base regions and said first conductivity type source regions, each of said unit transistor cells including respective span portions of said gate insulating layer and said gate electrode layer, which bridge a space between the first conductivity type source regions formed in two adjacent second conductivity base regions; and
   a buried-insulator region produced in said first conductivity type drain region layer beneath each of the portions of said gate electrode layer.

2. The vertical-type metal insulator field effect transistor device as set forth in claim 1, wherein said first conductivity type drain layer includes a first conductivity type semiconductor substrate, and a first conductivity type drift layer formed thereon and having a first conductivity type impurity concentration smaller than that of said first conductivity type semiconductor substrate, the production and arrangement of said second conductivity type base regions being carried out in said first conductivity type drift layer.

3. The vertical-type metal insulator field effect transistor device as set forth in claim 1, wherein each of said buried-insulator regions is integrated with a corresponding span portion of said gate insulating layer.

4. The vertical-type metal insulator field effect transistor device as set forth in claim 1, wherein each of the second conductivity type base regions has a depth which is equal to or more than that of each of said buried-insulator regions.

5. The vertical-type metal insulator field effect transistor device as set forth in claim 1, wherein each of said buried-insulator regions has more than ten times a thickness of said gate insulating layer.

6. The vertical-type metal insulator field effect transistor device as set forth in claim 1, wherein a space, which is defined between each of said buried-insulator regions and the adjacent second conductivity type base regions is set such that depletion regions, which are created along P-N junctions between the first conductivity type drain region layer and the second conductivity type base regions, are integrated with each other to thereby produce a single depletion region when a gate-drain is reversely biased.

7. The vertical-type metal insulator field effect transistor device as set forth in claim 1, wherein a frame-like isolation layer is formed on said first conductivity type drain region layer along peripheral sides thereof, such that a portion of said frame-like isolation layer is buried in said first conductivity type drain region layer.

8. The vertical-type metal insulator field effect transistor device as set forth in claim 1, wherein each of said buried-insulator regions is defined by vertical side wall faces.

9. The vertical-type metal insulator field effect transistor device as set forth in claim 1, wherein each of said buried-insulator regions is spaced apart from an adjacent one of said second conductivity type base regions by a constant distance.

* * * * *